(12) United States Patent
Yen et al.

(10) Patent No.: US 9,337,066 B2
(45) Date of Patent: May 10, 2016

(54) WAFER CLEANING MODULE

(71) Applicant: Taiwan Semiconductor Manufacturing Co., Ltd., Hsin-Chu (TW)

(72) Inventors: Yu-Ting Yen, Kaohsiung (TW);
Kao-Feng Liao, Hsinchu (TW);
Ying-Ho Chen, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 373 days.

(21) Appl. No.: 14/072,210

(22) Filed: Nov. 5, 2013

(65) Prior Publication Data
US 2015/0122291 A1  May 7, 2015

(51) Int. Cl.
| B08B 3/00 | (2006.01) |
| B08B 3/04 | (2006.01) |
| B08B 5/02 | (2006.01) |
| B08B 7/04 | (2006.01) |
| H01L 21/67 | (2006.01) |
| H01L 21/677 | (2006.01) |
| H01L 21/68 | (2006.01) |

(52) U.S. Cl.
CPC ............ *H01L 21/67057* (2013.01); *B08B 3/04* (2013.01); *H01L 21/67028* (2013.01); *H01L 21/67034* (2013.01); *H01L 21/67751* (2013.01); *H01L 21/681* (2013.01)

(58) Field of Classification Search
CPC .............. B08B 3/00; B08B 3/04; B08B 5/00; B08B 7/00; B08B 7/04; B08B 2203/00; B08B 2205/00; H01L 21/02028; H01L 21/67034; H01L 21/67057; H01L 21/67751; H01L 21/681
USPC ........... 134/31, 32, 37, 42, 61, 95.2, 137, 902
See application file for complete search history.

(56) References Cited

U.S. PATENT DOCUMENTS

2003/0154999 A1* 8/2003 Shih .......................... B08B 3/00
134/1.3

OTHER PUBLICATIONS

Imtec Acculine. "Accudry Product Sheet." Retrieved on Sep. 25, 2013. 2 Pages.

* cited by examiner

*Primary Examiner* — Saeed T Chaudhry
(74) *Attorney, Agent, or Firm* — Eschweiler & Associates, LLC

(57) ABSTRACT

The present disclosure relates to a wafer cleaning module for post CMP processes that reduces defects (e.g., watermarks, deposited particles) on a substrate, and an associated method. In some embodiments, the wafer cleaning module has a cleaning tank that may receive a semiconductor substrate within a cleaning medium. A pusher is may vertically move the semiconductor substrate from a starting position within the cleaning tank to an ending position. A position sensor may determine a position of the semiconductor substrate relative to a meniscus of the cleaning medium. Based upon the determined position, a control unit is may adjust a location of the starting position to a predetermined distance below the meniscus.

20 Claims, 5 Drawing Sheets

US 9,337,066 B2

WAFER CLEANING MODULE

Integrated chips are constructed using complex fabrication processes that form a plurality of different layers on top of one another. Many of the layers (e.g., back-end-of-the-line metal layers) are patterned using photolithography, in which a light sensitive photoresist material is selectively exposed to light. To ensure that the layers are formed with a good structural definition, the patterned light must be properly focused. To properly focus the pattered light, a substrate must be substantially planar to avoid depth of focus problems.

Chemical mechanical polishing (CMP) is a widely used process by which both chemical and physical forces are used to globally planarize a semiconductor substrate. The planarization prepares the substrate for the formation of a subsequent layer. After a CMP process is completed, the substrate is cleaned to remove any residue of the CMP process from the surface of the substrate.

DETAILED DESCRIPTION

Figure 1A:
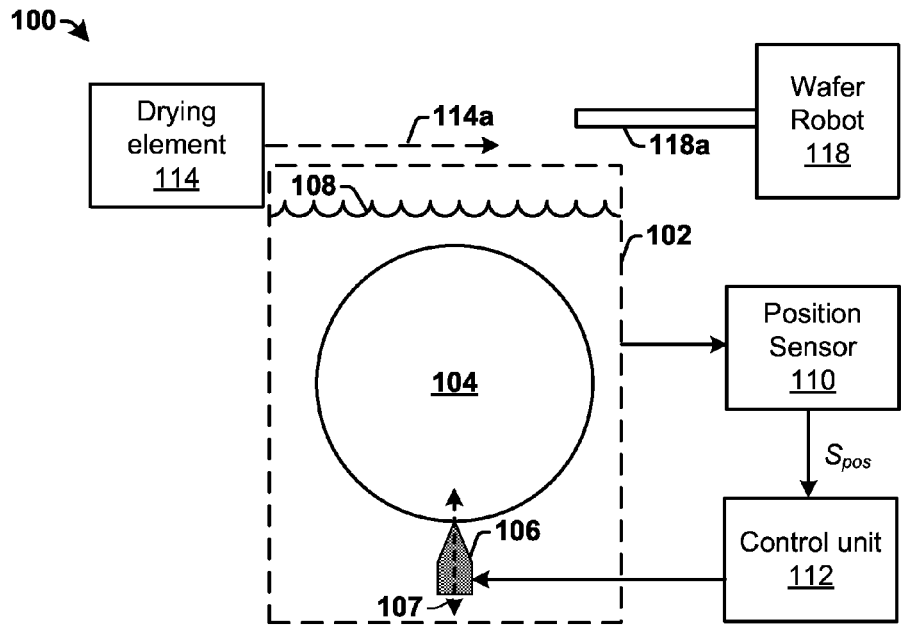
FIGS. 1A-1B illustrate some embodiments of a disclosed wafer cleaning module configured to receive a semiconductor substrate.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

After a substrate has undergone a chemical mechanical polishing (CMP) process, residue from the CMP process may remain on the substrate. Therefore, the substrate subsequently undergoes a cleaning process to remove the residue. Post CMP wafer cleaning modules may submerge a substrate within a cleaning medium in a cleaning tank. However, if the substrate is not sufficiently submerged within the cleaning medium, cleaning medium droplets may be left on portions of the substrate that are exposed to an ambient environment (e.g., air). As the droplets on a substrate evaporate, they may lead to the formation of defects, such as fall-on particles, crystal-like particles, watermarks, etc., on the substrate. For example, if an edge of a substrate moves out of the cleaning medium, residue from the cleaning medium may dry on the edge resulting in a watermark on the semiconductor substrate.

To prevent defects (e.g., watermarks) from appearing on a substrate, a manual calibration of a substrate position within the cleaning medium may be performed. The manual calibration moves the position of a substrate so that the substrate has a starting position below the cleaning medium. However, it has been appreciated that a starting position achieved by manual calibration may not be sufficiently precise, causing defects to randomly show up on substrate edges. For example, in cleaning tanks comprising a plurality of substrates, the manual calibration may move some substrates to starting positions that avoid defects, but may fail to move other substrates to starting positions that avoid defects.

Accordingly, the present disclosure relates to a wafer cleaning module for post CMP processes that reduces the formation of defects (e.g., fall-on particles, crystal-like particles, watermarks, etc.) on a substrate, and an associated method. In some embodiments, the wafer cleaning module comprises a cleaning tank configured to receive a semiconductor substrate within a cleaning medium. A pusher is configured to vertically move the semiconductor substrate from a starting position within the cleaning tank to an ending position. A position sensor is configured to determine a position of the semiconductor substrate relative to a meniscus of the cleaning medium. Based upon the determined position, a control unit is configured to adjust a location of the starting position to a predetermined distance below the meniscus.

Figure 1B:
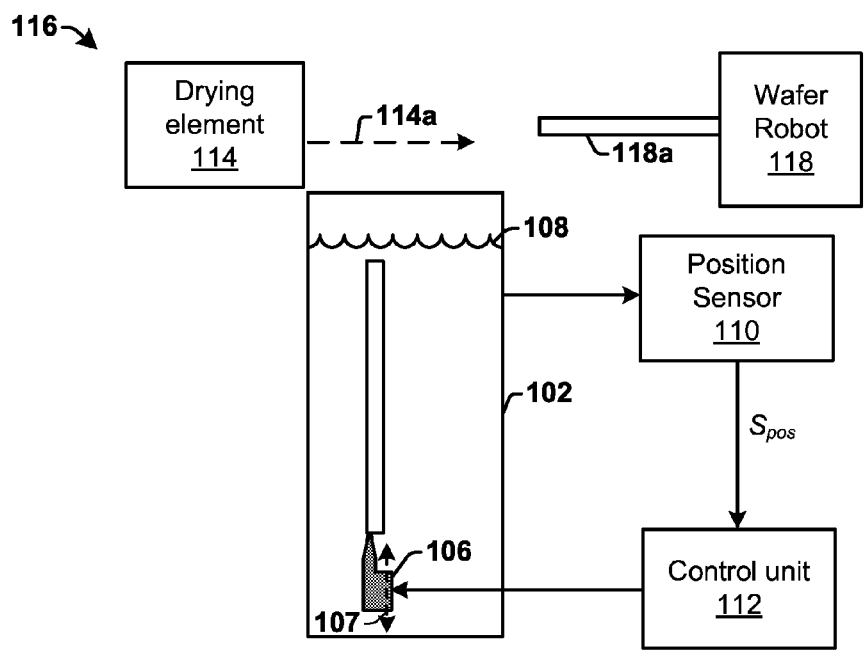

FIGS. 1A-1B illustrate some embodiments of a disclosed wafer cleaning module configured to receive a semiconductor substrate. The wafer cleaning module may be configured to perform a post chemical mechanical polishing (CMP) cleaning process to remove residue from a substrate that remains after a CMP process.

FIG. 1A illustrates a block diagram of some embodiments of a front-view of the disclosed wafer cleaning module 100. FIG. 1B illustrates a block diagram of some embodiments of a corresponding side-view 116 of disclosed wafer cleaning module 100.

The wafer cleaning module 100 comprises a cleaning tank 102 configured to receive a semiconductor substrate 104 that is to be cleaned. The cleaning tank 102 comprises a cleaning medium 108 (e.g., de-ionized water) that is configured to cover the semiconductor substrate 104, thereby immersing the semiconductor substrate 104 within the cleaning medium 108. In some embodiments, the semiconductor substrate 104 may comprise a wafer and/or a wafer cassette comprising a plurality of wafers. In some embodiments, the cleaning 108 may comprise de-ionized water.

A pusher 106 is located within the cleaning tank 102. The pusher 106 is configured to selectively move the semiconductor substrate 104 in a vertical direction 107 from a starting position to an ending position. In some embodiments, the pusher 106 is configured to contact the semiconductor substrate 104 at a point along a bottom of the semiconductor substrate 104 (i.e., a side of the semiconductor substrate that is opposite the meniscus of the cleaning medium 108). The pusher 106 is operably coupled to a control unit 112, which is configured to control movement of the pusher 106 in the vertical direction 107. As the pusher 106 moves in the vertical direction 107, the pusher 106 is configured to push the semiconductor substrate 104 out of the cleaning medium 108.

A drying element 114 is configured to dry the semiconductor substrate 104 as the semiconductor substrate 104 exits from the cleaning medium 108. The drying element 114 dries the semiconductor substrate 104 by removing residual cleaning medium 108 from the semiconductor substrate 104 as the semiconductor substrate 104 is pushed out of the cleaning medium 108 by the pusher 106. In some embodiments, the drying element 114 is configured to provide a drying vapor 114a comprising an isopropyl alcohol (IPA) vapor and/or a nitrogen ($N_2$) vapor to the semiconductor substrate 104 as the semiconductor substrate 104 is pushed out of the cleaning medium 108.

In some embodiments, a wafer robot 118 is configured to receive a semiconductor substrate 104 that is pushed out of the cleaning tank 102. The wafer robot 118 comprises a wafer blade 118a that is configured to receive the semiconductor substrate 104.

A position sensor 110 is configured to monitor a position of the semiconductor substrate 104 or pusher 106 within the cleaning tank 102. The position sensor 110 is configured to generate a signal $S_{pos}$ indicative of the monitored position of the pusher 106. The signal $S_{pos}$ is provided to a control unit 112. The control unit 112 is configured to adjust the starting position of the pusher 106, based upon the received signal $S_{pos}$ (i.e., the monitored position), to a starting position that causes the semiconductor substrate 104 to be held at a predetermined distance below a meniscus (i.e., cleaning medium/air interface) of the cleaning medium 108. For example, in some embodiments, a position of the pusher 106 can be adjusted to ensure that the semiconductor substrate 104 is a predetermined distance of at least 0.5 mm below the meniscus of the cleaning medium 108.

By adjusting the starting position to ensure that the semiconductor substrate 104 is at a position below the meniscus, the semiconductor substrate 104 is not exposed to an ambient environment that can cause a defect (e.g., fall-on particle, crystal like particle, watermark, etc.) to form on the semiconductor substrate 104.

Figure 2:
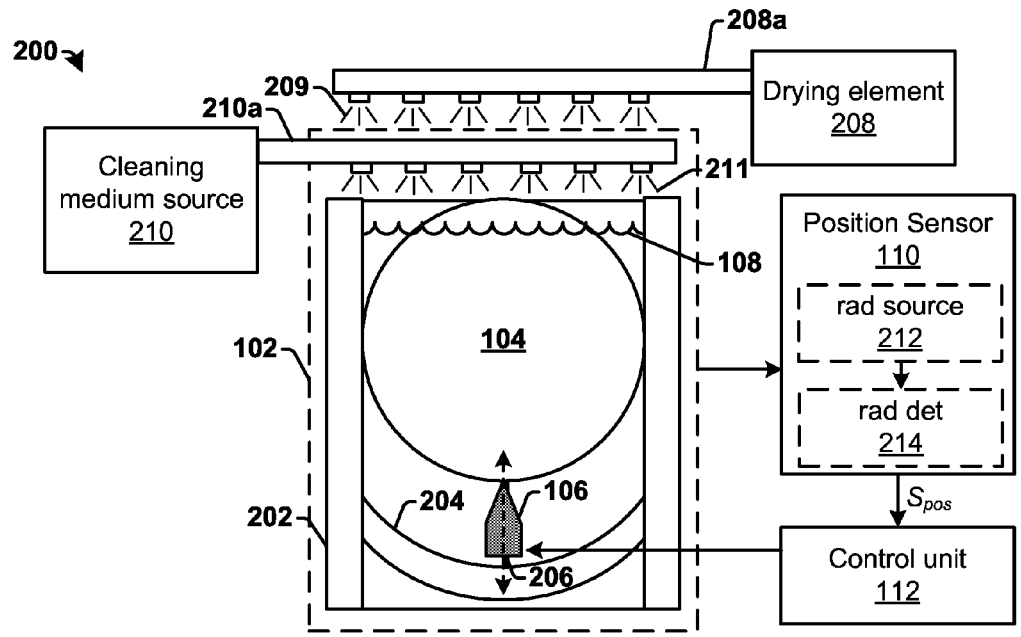
FIG. 2 illustrates a block diagram of some more detailed embodiments of a disclosed wafer cleaning module.

FIG. 2 illustrates a block diagram of some more detailed embodiments of a disclosed wafer cleaning module 200.

The wafer cleaning module 200 comprises a semiconductor wafer holder configured to support a semiconductor substrate 104 within a cleaning medium 108 (e.g., de-ionized water). In some embodiments, the semiconductor wafer holder comprises a crescent 204 and edge guides 202. The crescent 204 is located along a bottom surface of the wafer holder and has a curvature that is substantially the same as a semiconductor substrate 104 to be held. The edge guides 202 are disposed along the left and right sides of the wafer holder and are configured to guide the path of the semiconductor substrate 104 as it is pushed out of the cleaning medium 108 by a pusher 106 that runs along a vertical track 206.

A position sensor 110 is configured to monitor a position of the semiconductor substrate 104 or pusher within the cleaning tank 102. In some embodiments, the position sensor 110 comprises a radiation source 212 and a radiation detector 214. The radiation source 212 is configured to generate radiation that interacts with a moveable part of the wafer cleaning module 200 (e.g., the pusher 106 or the semiconductor substrate 104). The radiation detector 214 is configured to selectively receive the radiation and from the received radiation to determine a position of the semiconductor substrate 104 relative to a meniscus of the cleaning medium 108. A control unit 112 is configured to adjust the position of the pusher 106 based upon the signal $S_{pos}$.

In some embodiments, a calibration process may be performed on the position sensor 110. The calibration process may use a calibration substrate to calibrate the position sensor 110, so as to determine a relationship between the radiation and positions within the cleaning tank 102. In some embodiments, the control unit 112 may be configured to stop operation of a cleaning medium source 210 during the calibration process. After the calibration process has been performed, a position of the semiconductor substrate 104 can be tracked as the semiconductor substrate 104 is pushed out of the cleaning tank 102 based upon the received radiation.

In some embodiments, the wafer cleaning module 200 comprises a drying element 208 comprising a distribution element 208a located above the cleaning medium 108. The drying element 208 may be configured to provide a drying vapor 209 comprising isopropyl alcohol (IPA) and/or nitrogen ($N_2$) to the surface of the semiconductor substrate 104 as it exits the cleaning medium 108. The drying vapor 209 has a lower surface tension than the cleaning medium 108, so that as the drying vapor 209 comes into contact with residual cleaning medium 108, it absorbs in the cleaning medium 108 to form a surface tension gradient that causes the cleaning medium 108 to flow off of the semiconductor substrate 104 leaving it dry.

In some embodiments, the wafer cleaning module 200 comprises a cleaning medium source 210 comprising a distribution element 210a located above the cleaning medium 108. The cleaning medium source 210 may be configured to provide de-ionized water 211 to the cleaning tank 102. In some embodiments, the cleaning tank 102 may also comprise a drain (not shown) configured to remove cleaning medium 108 from the cleaning tank 102.

Figure 3:
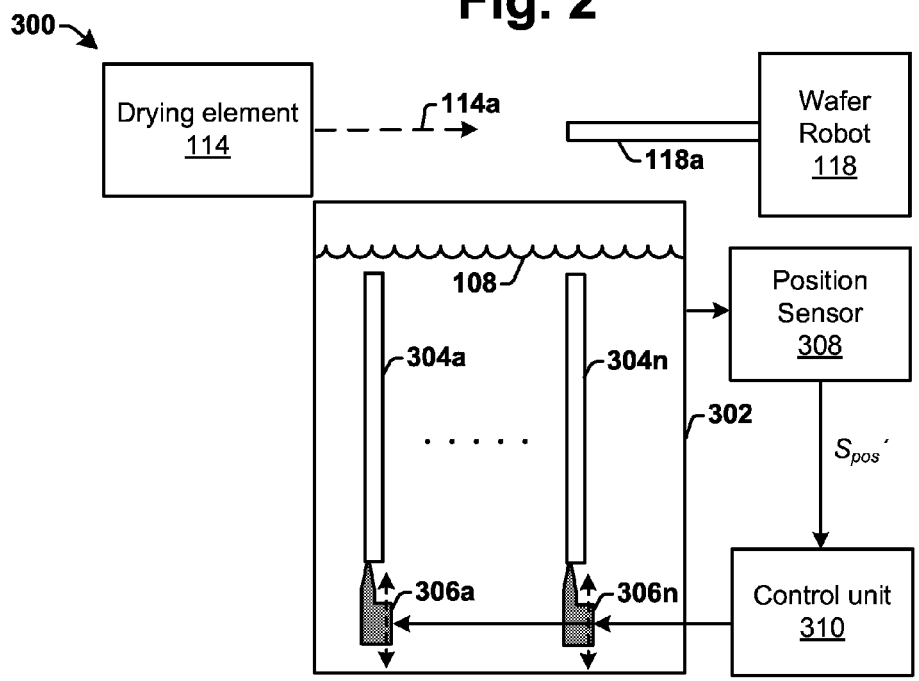
FIG. 3 illustrates a block diagram of some more detailed embodiments of a disclosed wafer cleaning module configured to receive a plurality of semiconductor substrates.

FIG. 3 illustrates some embodiments of a disclosed wafer cleaning module 300 configured to receive a plurality of semiconductor substrates 304a, . . . 304n.

The wafer cleaning module 300 comprises a cleaning tank 302 configured to receive a plurality of semiconductor substrates 304a, . . . , 304n that are to be cleaned (e.g., after a CMP process). The cleaning tank 302 comprises a plurality of pushers 306a, . . . , 306n, respectively configured to vertically move associated semiconductor substrates from a starting position to an ending position. For example, the cleaning tank 302 may comprise a first pusher 306a configured to push a first semiconductor substrate 304a from a first starting position to a first ending position and a second pusher 306n configured to push a second semiconductor substrate 304n from a second starting position to a second ending position.

A position sensor 308 is configured to monitor positions of the plurality of pushers 306a, . . . , 306n or semiconductor substrates 304a, . . . , 304n within the cleaning tank 302. The position sensor 308 is configured to provide signals $S_{pos}'$ indicative of the monitored positions to the control unit 312. The control unit 312 is configured to adjust the staring position of one or more of the pushers 306a, . . . , 306n based upon the signal $S_{pos}'$.

For example, if the position sensor 308 determines that a first pusher 306a is at a position that sufficiently immerses a first semiconductor substrate 304a within the cleaning medium 108, then the control unit 310 will not adjust the starting position of the first pusher 306a. However, if the position sensor 308 determines that a second pusher 306b is at a position that may lead to a defect (e.g., fall-on particle, crystal-like particle, watermark, etc.) on a second semiconductor substrate 304b, then the control unit 310 will adjust the starting position of the second pusher 306b to a position that will keep the second semiconductor substrate 304b immersed within the cleaning medium 108 until it is pushed out during a drying process.

Figure 4:
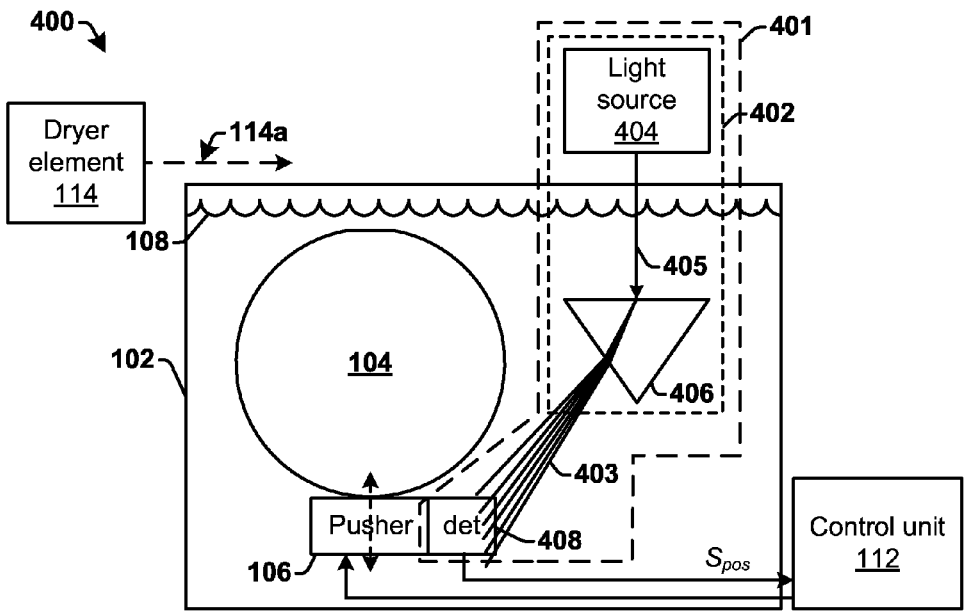
FIG. 4 illustrates some embodiments of a disclosed wafer cleaning module having a position sensor comprising a prismatic radiation source and a radiation detector coupled to a pusher.

FIG. 4 illustrates some embodiments of a disclosed wafer cleaning module 400 having a position sensor 401 comprising a prismatic radiation source 402 configured to generate radiation 403 that is provided to a detector 408 coupled to a pusher 106.

The prismatic radiation source 402 is configured to generate radiation 403 having wavelengths that span a relatively wide range (e.g., hundreds of nanometers). For example, the prismatic radiation source 402 may be configured to generate radiation 403 that spans the visible spectrum wavelengths (i.e., from about 390 nm to 700 nm). The radiation 403 is provided to the cleaning tank 102, wherein the different wavelengths are provided to different positions within the cleaning tank 102.

A radiation detector 408 is attached to the pusher 106. The radiation detector 408 is configured to detect a wavelength of received radiation 403. The wavelengths are provided to a control unit 112, which is configured to determine a position of the pusher 106 from the wavelength. For example, if the radiation detector 408 measures radiation 403 having a red wavelength the control unit 112 is able to determine that the pusher 106 is at a first position, while if the radiation detector 408 measures radiation 403 having a blue wavelength the control unit 112 is able to determine that the pusher 106 is at a second position above the first position.

In some embodiments, the prismatic radiation source 402 comprises a light source 404 and a dispersive prism 406. The light source 404 is configured to generate radiation 405 comprising white light, which is provided to the dispersive prism 406. The dispersive prism 406 is configured to break the white light into the radiation 403 comprising constituent spectral colors of red, orange, yellow, blue, indigo, violet, which will travel to different positions within the cleaning tank 102. The different wavelengths of the constituent spectral colors can be detected by the radiation detector 408.

In some embodiments, the light source 404 is located out of the cleaning medium 108 while the dispersive prism 406 is located within the cleaning medium 108. In such embodiments, the light source 404 is configured to generate radiation 405 that travels vertically from air to the cleaning medium 108 (e.g., so that the angle of the radiation entering the cleaning medium 108 is the same as the angle of the radiation reaching the dispersive prism 406).

In some embodiments, a calibration process may be performed on the position sensor 401 to determine what wavelength of radiation 403 corresponds to what positions within the cleaning tank 102. After the calibration process has been performed, a position of the semiconductor substrate 104 can be tracked as the semiconductor substrate 104 is pushed out of the cleaning tank 102 by measuring the wavelengths. The wavelengths are sent back to the control unit 112 and when a target wavelength is received the control unit 112 is configured to stop the pusher 106 at an adjusted starting point that keeps the semiconductor substrate 104 a predetermined distance below the meniscus.

Figure 5:
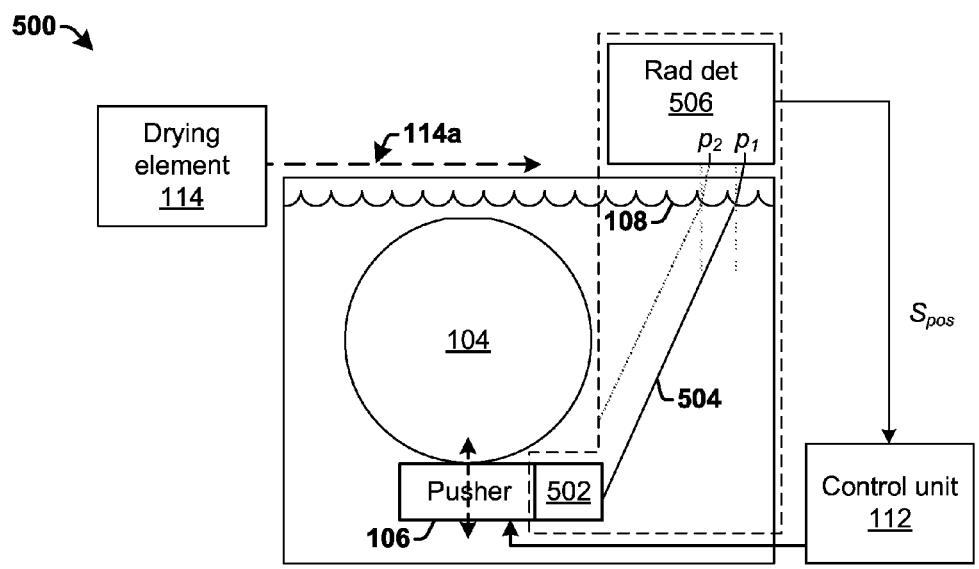
FIG. 5 illustrates some embodiments of a disclosed wafer cleaning module having a position sensor comprising a light detector configured to receive radiation from a light source coupled to a pusher.

FIG. 5 illustrates some embodiments of a disclosed wafer cleaning module 500 having a position sensor 501 comprising a radiation source 502 coupled to a pusher 106 and a radiation detector 506 located outside of the cleaning tank 102.

The radiation source 502 is configured to generate radiation 504 that is directed at a meniscus of a cleaning medium 108 at a fixed angle. In some embodiments, the radiation source 502 is configured to generate radiation 504 comprising white light. In various other embodiments, the radiation source 502 may be configured to generate radiation at a variety of wavelengths.

The radiation detector 506 is positioned above the cleaning medium 108. The radiation detector 506 is configured to receive radiation 504 from the radiation source 502. As the radiation 504 from the radiation source 502 hits the surface of the cleaning medium 108, it will be defracted to a position that is a function of the position of the pusher 106, thereby causing the radiation 504 to be received by the radiation detector 506 at different positions.

For example, if the pusher 106 is at a first vertical position, radiation 504 will be refracted to a first position $p_1$, while if the pusher 106 is at a second vertical position, radiation 504 will be refracted to a second position $p_2$. The radiation detector 506 is configured to receive the refracted radiation, and based upon the position of the refracted radiation to determine a position of the pusher 106 within the cleaning tank 102. From the position, a distance between a top of the semiconductor substrate 104 and surface of the cleaning medium 108 can be determined.

In some embodiments, a calibration process may be performed on the position sensor 501. The calibration process may use a calibration wafer to calibrate the position sensor 501, to determine what positions of refracted radiation correspond to what positions of the pusher 106 within the cleaning tank 102. After the calibration process has been performed, a position of the pusher 106 can be tracked as the semiconductor substrate 104 is pushed out of the cleaning tank 102 by measuring the positions of refracted radiation.

Figure 6:
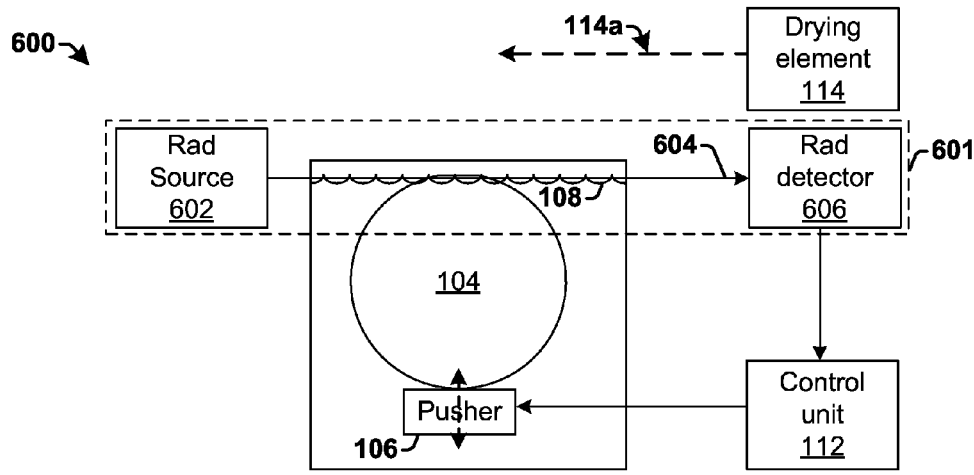
FIG. 6 illustrates some embodiments of a disclosed wafer cleaning module having a position sensor comprising a radiation source and a radiation detector set up on a substantially same level as a meniscus of a cleaning medium.

FIG. 6 illustrates some embodiments of a disclosed wafer cleaning module 600 having a position sensor 601 comprising a radiation source 602 and a radiation detector 606.

The radiation source 602 and the radiation detector 606 are set up on a substantially same vertical position as a surface (i.e., meniscus) of the cleaning medium 108. The radiation source 602 is configured to generate radiation 604 that is sent towards the radiation detector 606 in a direction that is parallel to the surface of the cleaning medium 108. A pusher 106 will push a semiconductor substrate 104 out of the cleaning medium 108, until the semiconductor substrate 104 intersects the meniscus of the cleaning medium 108. Upon intersecting the meniscus, the semiconductor substrate 104 will interrupt the radiation 604 traveling from the radiation source 602 to the radiation detector 606, such that the radiation detector 606 will no longer detect the radiation 604. The detected interruption in radiation is conveyed to the control unit 112, thereby allowing for the control unit 112 to determine the position of pusher 106.

In some embodiments, a calibration process may be performed on the position sensor 601. The calibration process may use a calibration substrate to determine a position at which the calibration substrate exits the cleaning medium 108. After the calibration process has been performed, the position at which the calibration substrate exits the cleaning medium 108 can be used to adjust a starting position of the pusher 106 to keep the semiconductor substrate 104 under the cleaning medium 108.

Figure 7:
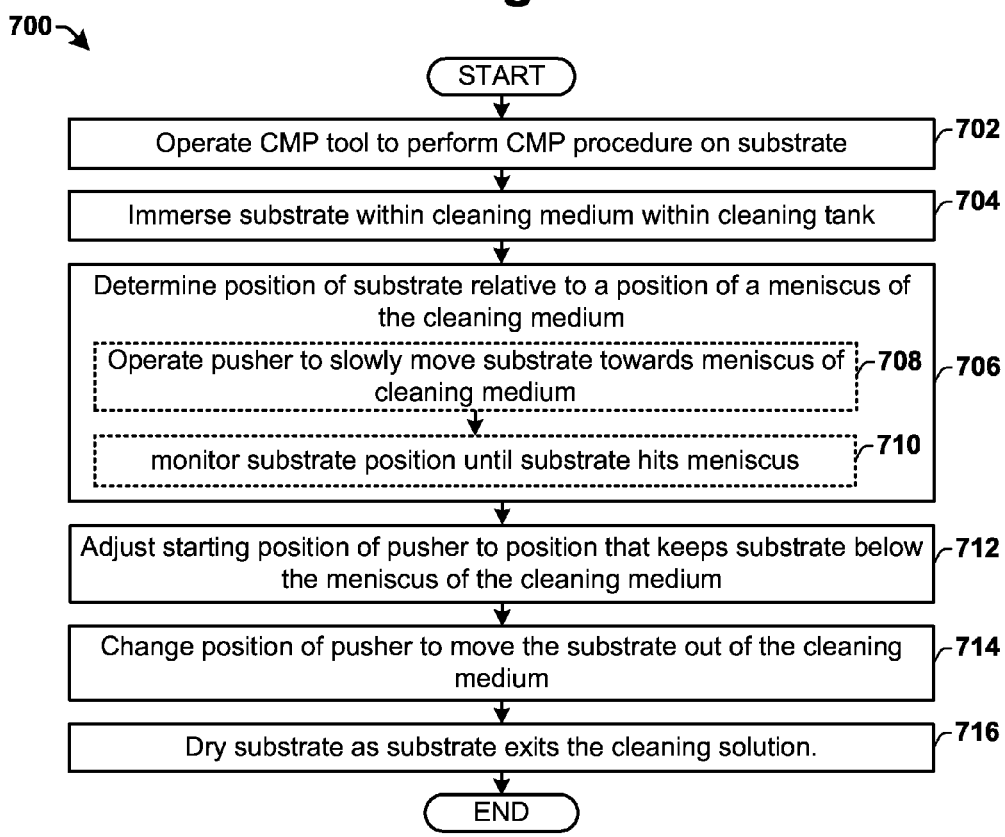
FIG. 7 illustrates a flow diagram of some embodiments of a post chemical mechanical polishing wafer cleaning process.

FIG. 7 illustrates a flow diagram 700 of some embodiments of a method of performing a post chemical mechanical polishing wafer cleaning process.

While method 700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 702, a chemical mechanical polishing (CMP) tool is operated to perform a chemical mechanical polishing (CMP) procedure on a substrate. A typical CMP tool comprises a rotating platen covered by a polishing pad. A slurry distribution system is configured to provide a polishing mixture, having abrasive components, to the polishing pad. The substrate is brought into contact with the pad, causing the rotating platen to planarize the substrate.

At 704, the substrate is immersed within a cleaning medium within a cleaning tank at a position that abuts a pusher configured to control a vertical motion of the substrate within the cleaning tank. The cleaning medium is configured to remove residue from the CMP process from the substrate.

At 706, a position of the substrate or the pusher, relative to a position of a meniscus of the cleaning medium, is determined. In some embodiments, the position of the substrate or the pusher may be determined by performing a calibration process. In such embodiments, the calibration process may be performed by operating a pusher to slowly move a calibration substrate towards meniscus of the cleaning medium, at 708. While the calibration substrate is being pushed towards the meniscus, the position of the substrate relative to the meniscus is monitored to determine when the calibration substrate hits the meniscus, at 710.

In some embodiments, the position of the substrate may be monitored by generating radiation that spans the visible spectrum wavelengths and by providing the generated radiation to varying positions within the cleaning tank. A wavelength of the radiation is detected at the pusher. Once the substrate hits the meniscus, the detected wavelengths are calibrated to correspond to positions of the pusher within the cleaning tank. In some embodiments, the radiation may be generated by using a dispersive prism to break white light into the radiation comprising constituent spectral colors of red, orange, yellow, blue, indigo, violet, which are provided to different locations within the cleaning tank.

In other embodiments, the position of the substrate may be determined by operating a radiation source connected to the pusher to generate radiation that is provided at a fixed angle towards the meniscus. A position at which the radiation from the radiation source is received is used to determine a position of the pusher.

In yet other embodiments, radiation is provided in a direction that is parallel to and at a substantially same level as the meniscus of the cleaning medium. The radiation is monitored at a detector that is located along the meniscus. Upon intersecting the meniscus, the semiconductor substrate will interrupt the radiation traveling from the radiation source to the radiation detector.

At 712, a starting position of the pusher is adjusted to keep the substrate at a predetermined position below the meniscus of the cleaning medium.

At 714, a position of the pusher is changed to push the substrate out of the cleaning medium.

At 716, the substrate is dried as the substrate exits the cleaning solution by providing a drying vapor to the surface of the substrate. In some embodiments, the drying vapor may comprise isopropyl alcohol (IPA) and/or nitrogen ($N_2$).

Figure 8A:
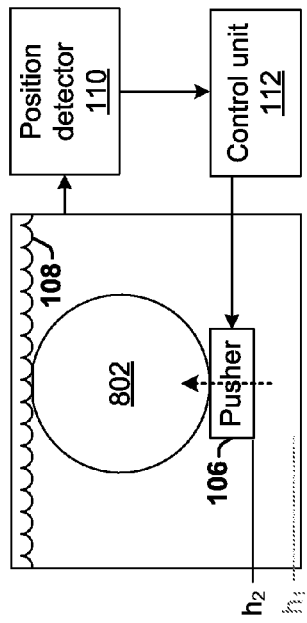
FIGS. 8A-8C illustrate some embodiments of a calibration process for a chemical mechanical polishing wafer cleaning process.
Figure 8B:
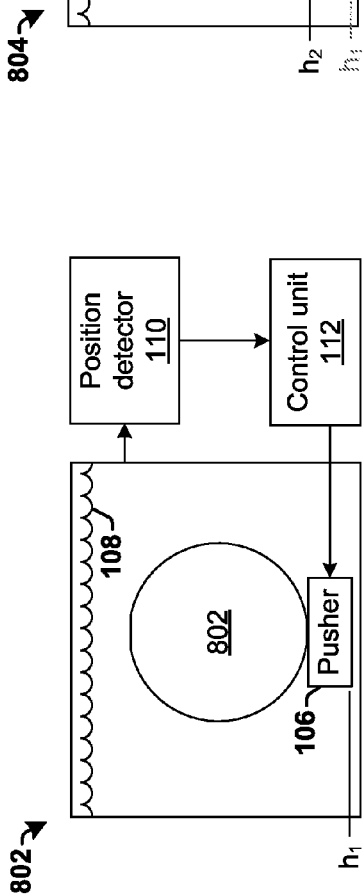
Figure 8C:
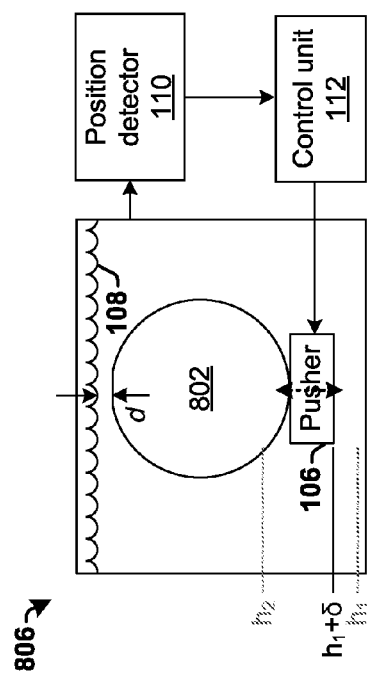

FIGS. 8A-8C illustrate some embodiments of a calibration process corresponding to act 706.

As shown in FIG. 8A, a pusher 106 begins at a first height $h_1$. In FIG. 8B, the pusher 106 is raised to a second height $h_2$ that causes the calibration substrate 802 to hit a meniscus of a cleaning medium 108. The control unit 112 receives the position at which the calibration substrate 802 hits the meniscus of the cleaning medium 108 and therefrom can determine a distance between the calibration substrate 108 and the meniscus. The control unit 112 then adjusts the starting point of the pusher to a height $h_1+\delta$ that keeps the calibration substrate 802 a predetermined distance d below the meniscus.

It will be appreciated that while reference is made throughout this document to exemplary structures in discussing aspects of methodologies described herein, that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures and description describe a method and apparatus to mitigate wafer defects that are describes as being fall-on particles, crystal-like particles, or watermark, it will be appreciated that such defect types are not limiting but are included as examples. Rather, the described figures and methods may mitigate a wide variety of detects that result from the exposure of a substrate to an ambient environment outside of a cleaning medium.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

The present disclosure relates to a wafer cleaning module for post CMP processes that reduces defects (e.g., watermarks, fall-on particles, crystal-like particles, etc.) on a substrate, and an associated method.

In some embodiments, the present disclosure relates to a wafer cleaning module. The wafer cleaning module comprises cleaning tank configured to receive a semiconductor substrate within a cleaning medium. The wafer cleaning module further comprises a pusher configured to vertically move the semiconductor substrate from a starting position within the cleaning tank to an ending position. The wafer cleaning module further comprises a position sensor configured to determine a position of the semiconductor substrate relative to a meniscus of the cleaning medium. The wafer cleaning module further comprises a control unit configured to adjust the starting position, based upon the position of the semiconductor substrate, to keep the semiconductor substrate at a predetermined distance below the meniscus.

In other embodiments, the present disclosure relates to a wafer cleaning module. The wafer cleaning module comprises a cleaning tank configured to receive a semiconductor substrate within a cleaning medium. The wafer cleaning module further comprises a pusher configured to vertically move the semiconductor substrate from a starting position within the cleaning tank to an ending position. The wafer cleaning module further comprises a radiation source configured to generate a radiation and a radiation detector configured to selectively receive the radiation and to determine a position of the semiconductor substrate relative to a meniscus of the cleaning medium based upon the received radiation. The wafer cleaning module further comprises a control unit configured to adjust the starting position, based upon the position of the semiconductor substrate, to keep the semiconductor substrate at a predetermined distance below the meniscus.

In yet other embodiments, the present disclosure relates to a method of performing a post chemical mechanical polishing wafer cleaning process. The method comprises immersing a substrate within a cleaning medium within a cleaning tank at a position that abuts a pusher configured to control vertical motion of the substrate within the cleaning tank. The method further comprises determining a position of substrate relative to a position of a meniscus of the cleaning medium. The method further comprises adjusting a starting position of the pusher to keep the semiconductor substrate at a predetermined distance below the meniscus.

What is claimed is:

1. A wafer cleaning module, comprising:
   a cleaning tank configured to receive a semiconductor substrate within a cleaning medium,
   a pusher configured to vertically move the semiconductor substrate from a starting position within the cleaning tank to an ending position;
   a position sensor configured to determine a position of the semiconductor substrate relative to a meniscus of the cleaning medium; and
   a control unit configured to adjust the starting position, based upon the position of the semiconductor substrate, to keep the semiconductor substrate at a predetermined distance below the meniscus.

2. The wafer cleaning module of claim 1, further comprising:
   a drying element configured to dry the semiconductor substrate by removing residual cleaning medium from the semiconductor substrate as the semiconductor substrate exits the cleaning medium.

3. The wafer cleaning module of claim 2, wherein the drying element is configured to provide a drying vapor comprising isopropyl alcohol (IPA) or nitrogen ($N_2$) to a surface of the semiconductor substrate.

4. The wafer cleaning module of claim 1, wherein the position sensor comprises:
   a prismatic radiation source configured to provide radiation spanning visible spectrum wavelengths to various positions within the cleaning tank; and
   a radiation detector connected to the pusher and configured to detect a wavelength of the radiation, wherein the wavelength of the radiation corresponds to a position of the pusher within the cleaning tank.

5. The wafer cleaning module of claim 4, wherein the prismatic radiation source comprises:
   a light source configured to generate a white light; and
   a dispersive prism configured to break the white light into the radiation comprising constituent spectral colors of red, orange, yellow, blue, indigo, violet.

6. The wafer cleaning module of claim 5,
   wherein the light source is located outside of the cleaning medium and wherein the dispersive prism is located within the cleaning medium; and
   wherein the light source is located at a position that is vertically above the prism, so that the white light perpendicularly intersects the cleaning medium.

7. The wafer cleaning module of claim 1, wherein the position sensor comprises:
   a radiation source connected to the pusher and configured to generate radiation that is provided towards the meniscus of the cleaning medium; and
   a radiation detector positioned above the cleaning medium, wherein the radiation detector is configured to receive the radiation from the radiation source and to determine a position of the pusher from the radiation.

8. The wafer cleaning module of claim 1, wherein the position sensor comprises:
   a radiation source positioned at a same vertical position as the meniscus of the cleaning medium, wherein the radiation source is configured to generate radiation that is provided a direction that is parallel to a surface of the cleaning medium; and
   a radiation detector configured to selectively detect the radiation and to determine a position of the substrate from the radiation.

9. The wafer cleaning module of claim 1, wherein the cleaning medium comprises de-ionized water.

10. The wafer cleaning module of claim 1,
    wherein the cleaning tank is configured to receive a first semiconductor substrate and a second semiconductor substrate;
    wherein a first pusher is configured to vertically move the first semiconductor substrate within the cleaning tank from a first starting position to a first ending position; and
    wherein a second pusher is configured to vertically move the second semiconductor substrate within the cleaning tank from a second starting position to a second ending position.

11. A wafer cleaning module, comprising:
    a cleaning tank configured to receive a semiconductor substrate within a cleaning medium;
    a pusher configured to vertically move the semiconductor substrate from a starting position within the cleaning tank to an ending position;
    a radiation source configured to generate a radiation;
    a radiation detector configured to selectively receive the radiation and to determine a position of the semiconductor substrate relative to a meniscus of the cleaning medium based upon the radiation; and
    a control unit configured to adjust the starting position, based upon the position of the semiconductor substrate, to keep the semiconductor substrate at a predetermined distance below the meniscus.

12. The wafer cleaning module of claim 11, further comprising:
    a drying element configured to dry the semiconductor substrate as the semiconductor substrate is exits the cleaning medium by providing a drying vapor comprising isopropyl alcohol (IPA) or nitrogen ($N_2$) to a surface of the semiconductor substrate.

13. The wafer cleaning module of claim 11,
    wherein the radiation source comprises a prismatic radiation source configured to provide the radiation, spanning visible spectrum wavelengths, to various positions within the cleaning tank; and
    wherein the radiation detector is connected to the pusher and is configured to detect a wavelength of the radiation, wherein the wavelength of the radiation corresponds to a position of the pusher within the cleaning tank.

14. The wafer cleaning module of claim 13, wherein the prismatic radiation source comprises:
  a light source configured to generate a white light; and
  a dispersive prism configured to break the white light into the radiation comprising constituent spectral colors of red, orange, yellow, blue, indigo, violet.

15. The wafer cleaning module of claim 14,
  wherein the light source is located outside of the cleaning medium and wherein the dispersive prism is located within the cleaning medium; and
  wherein the light source is located at a position that is vertically above the prism, so that the white light perpendicularly intersects the cleaning medium.

16. The wafer cleaning module of claim 11,
  wherein the radiation source is connected to the pusher and configured to generate the radiation, which is provided towards the meniscus of the cleaning medium; and
  wherein the radiation detector is positioned above the cleaning medium, wherein the radiation detector is configured to receive the radiation from the radiation source and to determine a position of the pusher from the radiation.

17. The wafer cleaning module of claim 11,
  wherein the radiation source is positioned at a same vertical position as the meniscus of the cleaning medium, wherein the radiation source is configured to generate radiation that is provided a direction that is parallel to a surface of the cleaning medium; and
  wherein the radiation detector is configured to selectively detect the radiation and to determine a position of the substrate from the radiation.

18. A method of performing a post chemical mechanical polishing wafer cleaning process, comprising:
  immersing a substrate within a cleaning medium within a cleaning tank at a position that abuts a pusher configured to control vertical motion of the substrate within the cleaning tank;
  determining a position of substrate relative to a position of a meniscus of the cleaning medium; and
  adjusting a starting position of the pusher to keep the substrate at a predetermined distance below the meniscus.

19. The method of claim 18, further comprising:
  changing position of the pusher to move the substrate out of the cleaning medium; and
  drying the substrate by removing residual cleaning medium from the substrate as the substrate exits the cleaning medium.

20. The method of claim 19, further comprising:
  operating a chemical mechanical polishing tool to perform a chemical mechanical polishing procedure on the substrate prior to immersing the substrate within the cleaning medium.

* * * * *